United States Patent
Poli et al.

(10) Patent No.: US 7,843,061 B2
(45) Date of Patent: Nov. 30, 2010

(54) TRANSPARENT SUBSTRATE WITH INVISIBLE ELECTRODES AND DEVICE INCORPORATING THE SAME

(75) Inventors: Gian-Carlo Poli, Les Geneveys-sur-Coffrane (CH); Joachim Grupp, Enges (CH); Pierre-Yves Baroni, Colombier (CH)

(73) Assignee: Asulab S.A., Marin (CH)

( * ) Notice: Subject to any disclaimer, the term of this patent is extended or adjusted under 35 U.S.C. 154(b) by 1758 days.

(21) Appl. No.: 10/998,800

(22) Filed: Nov. 30, 2004

(65) Prior Publication Data

US 2005/0116343 A1   Jun. 2, 2005

(30) Foreign Application Priority Data

Dec. 1, 2003    (EP) .................................. 03027566

(51) Int. Cl.
*H01L 31/042*    (2006.01)
*H01L 31/0224*   (2006.01)
*G02F 1/1343*    (2006.01)

(52) U.S. Cl. .................. 257/749; 257/43; 257/448; 257/E31.126; 257/E23.015; 349/143; 977/781; 977/784

(58) Field of Classification Search .................. 257/43, 257/449, 617, 746, 749, 59, 72, 448, E31.126, 257/E23.015; 977/781, 784, 780; 349/143
See application file for complete search history.

(56) References Cited

U.S. PATENT DOCUMENTS

| | | | |
|---|---|---|---|
| 4,228,534 A | | 10/1980 | Fellrath et al. |
| 5,015,075 A | * | 5/1991 | Ito et al. ...................... 359/275 |
| 5,859,722 A | * | 1/1999 | Suga et al. .................. 359/265 |
| 6,225,577 B1 | | 5/2001 | Sawai et al. |
| 7,449,732 B2 | | 11/2008 | Grupp et al. |
| 2003/0103256 A1 | * | 6/2003 | Berneth et al. .............. 359/265 |

FOREIGN PATENT DOCUMENTS

| | | |
|---|---|---|
| DE | 32 36 099 A1 | 3/1984 |
| EP | 1 207 439 A1 | 5/2002 |
| EP | 1 457 865 A1 | 9/2004 |
| WO | WO 93/19479 | 9/1993 |
| WO | WO 99/32945 | 7/1999 |

OTHER PUBLICATIONS

European Search Report, completed Apr. 22, 2004.

* cited by examiner

*Primary Examiner*—Allan R. Wilson
*Assistant Examiner*—Yu Chen
(74) *Attorney, Agent, or Firm*—Griffin & Szipl, P.C.

(57) ABSTRACT

The electrodes (7) and the contact zones (15) are structured in a film of a transparent conductive oxide (TCO), deposited on a transparent support (1) possibly coated with an intermediate film (3), while being separated by dielectric spaces (9) formed by nano fissures (11) obtained by UV radiation and passing through the TCO film. A protective film (13) can coat the electrodes (7) and the dielectric spaces (9).

13 Claims, 3 Drawing Sheets

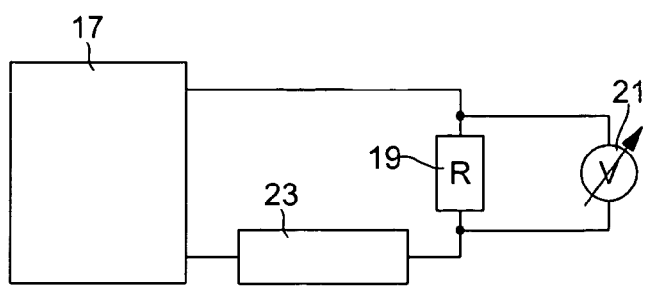
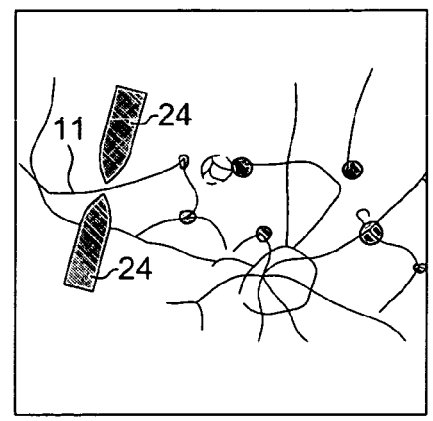
Fig.7  Fig. 8
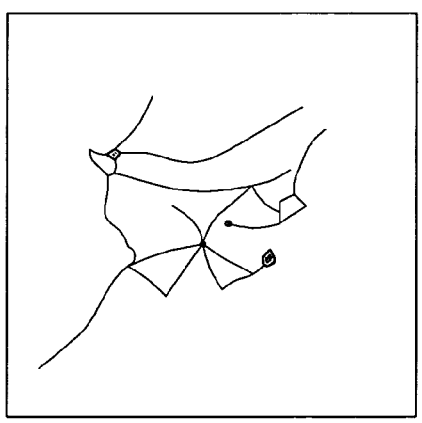
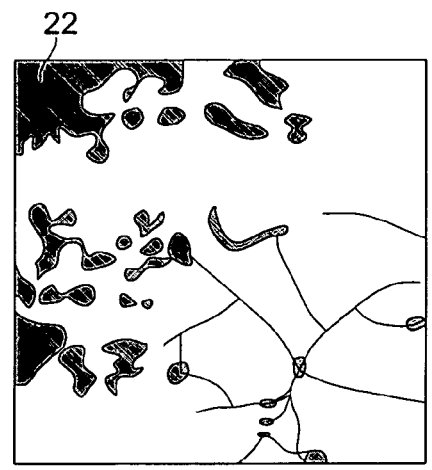
Fig.9  Fig. 10
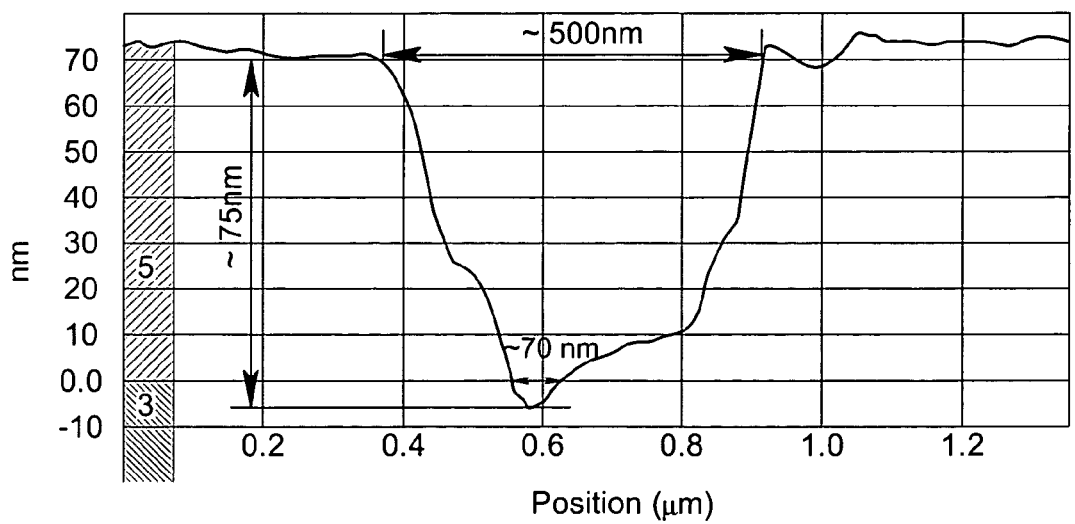
Fig. 11

TRANSPARENT SUBSTRATE WITH INVISIBLE ELECTRODES AND DEVICE INCORPORATING THE SAME

This application claims priority from European Patent Application No. 03027566.3 filed Dec. 1, 2003, the entire disclosure of which is incorporated herein by reference.

FIELD OF THE INVENTION

The present invention concerns a transparent substrate having at least one face provided with transparent electrodes, whose structure is such that their contours cannot be perceived by an observer in the visible light wavelength range.

The invention also concerns devices, generally electronic apparatus, including one or more transparent substrates with invisible electrodes in which the electrodes have command or electric energy collector roles, and more specifically such devices arranged above the display of an electronic apparatus on which one should be able to read the data from said display, without being disturbed by the structure and arrangement of the electrodes.

The invention also concerns a method for structuring, in an economical manner and with high precision, electrodes on any transparent electrode while providing optical compensation between the electrodes to make their contours invisible.

BACKGROUND TO THE INVENTION

Solutions have already been proposed to make the interface formed by the electrodes arranged between a display and an observer remain as discreet as possible and to avoid damaging the aesthetic appearance of the electronic apparatus, particularly in the case of a timepiece. For example, wristwatches are known in which the inner face of the glass includes electrodes allowing tactile control of the time or non time-related functions by capacitive or resistive effect, as is disclosed in a non-limiting manner in U.S. Pat. No. 4,228,534 and EP Patent Nos. 0 674 247 and 1 207 439. The glass can also be replaced or completed by a cell formed of two substrates with transparent electrodes between which an active material is placed, for example to form a photovoltaic cell forming the energy source as described in WO Patent No. 93/19479, or to form a liquid crystal cell able to have a transparent state or a state for displaying complementary or different data to that displayed on a subjacent dial, as described in WO Patent No. 99/32945.

In order to make the electrodes transparent conductor oxides (TCO) are used in a known manner, i.e. materials which are both good conductors and transparent in the visible field, such as tin and indium oxide (ITO), $In_2O_3$ or $SnO_2$ doped with antimony. Transparent conductive polymer, which are organic components with conjugated double bonds whose conductivity can be improved by chemical or electrochemical doping, can also be used as a conductive film for structuring the electrodes. It may be, for example a polyacetylene or polyanilines such as Ormecon®. These films, of the order of 50 to 100 nm, are carried out directly onto the transparent substrate or onto an intermediate layer via a large number of known techniques, such as sputtering, evaporation, the sol-gel technique, and chemical vapour deposition (CDV), from which laser assisted chemical vapour deposition should be noted (LICVD).

As regards the structure of the electrodes, there also exist various known methods implemented by using at least one mask corresponding to the contour of the electrodes, either during the deposition of the TCO by localised crystallisation of a sol-gel film by UV laser irradiation, or by carrying out, on a continuous TCO film, a chemical etch or localised ablation by UV laser irradiation with sufficient fluence. The nature of the transparent substrate, glass or plastic is evidently a determining factor, from the technical and economical point of view, for the choice of process to be applied. Localised crystallisation of a sol-gel film by UV laser is hardly, for example, applicable to a plastic substrate, such as PMMA, since it is a photothermal process.

Moreover, the use of very aggressive chemical components in the selective etching methods can lead to degradation of the substrate or of an intermediate layer inserted between said substrate and the TCO film, such that the non-conductive spaces between the electrodes can still remain perceptible to the naked eye whatever the method used for filling the non-conductive spaces these non-conductive spaces can also be visible because of the difficulty in filling them without forming bulges or depressions capable of deviating the light rays, given that it is necessary to use two complementary masks, respectively for etching and for filling.

In order to overcome the aforementioned drawback, the method proposed in European Patent Application No. 03005615.4 (published as EP 1 457 865 A1) and in U.S. Pat. No. 7,449,732 B2, both of which are in the name of the Applicant, incorporated herein by reference, consists in using a single mask employing a laser radiation whose features (fluence, number of impulses, frequency) are adjusted in accordance with two different modes for two successive steps. The first step consists in totally eliminating the TCO in the non-conductive spaces, and the second step in causing deposition of a material having a suitable refractive index and thickness in said spaces. It seemed in fact quite obvious that two electrodes close to each other could only be electrically insulated by removing any trace of conductive material in the space separating them.

SUMMARY OF THE INVENTION

Surprisingly, however, it has appeared that the electric conductivity could be lowered to such a low level that two close electrodes could be electrically insulated, without however eliminating the TCO, which enables the initial optical properties to be kept, and thus the contours of the electrodes to be made invisible, from whatever angle a transparent electrode carrying said electrodes is observed.

The invention therefore concerns a transparent electrode with invisible electrodes including a transparent support on which a transparent conductive film is deposited, wherein the electrodes are structured with contours separated by non-conductive spaces. The substrate is characterised in that the conductive film at the location of said non-conductive spaces includes nano fissures or cracks, most of which pass through the entire thickness of the conductive film, interrupting the electric conductivity between neighbouring electrodes, without altering the path of a light ray in a way perceptible to the naked eye. The edges of these nano fissures or cracks are at the most separated by a few microns and cannot be seen by an observer whose visual acuity does not enable him to distinguish, at near vision (20-30 cm), objects less than $1/10^{th}$ of a millimeter away.

The conductive film can be a transparent conductive oxide (TCO), but also a transparent conductive polymer. However, in the following description reference will essentially be made to TCOs which are the best known products for making transparent electrodes.

In a preferred embodiment, preferably upon deposition of a TCO film, the transparent support is coated with a film of hard transparent non-conductive material (hard coating), which contributes towards forming nano fissures.

According to another preferred embodiment, after structuring the electrodes, the entire surface of the substrate, i.e. the electrodes and the non-conductive spaces, with the possible exception of the contact zones of the electrodes, is coated with a protective film, that may also have anti-reflective properties contributing towards stabilising the nano fissures over time.

The nano fissures in the TCO film are obtained by UV radiation by means of a laser source. In order to do this, the method comprises the steps of:

placing the substrate, formed of the support and the TCO film, possibly deposited on an intermediate layer, in a sealed enclosed space having a gaseous fluid supply and a pumping outlet;

inserting, between the UV radiation source and the substrate, a mask including windows transparent to UV radiation, said windows reproducing the desired contours of the non-conductive spaces, and as a function of the materials used to form the substrate, their thickness and the choice of the emitting source, adjusting the features of the radiation to cause a nano fissure in the TCO film without removing matter.

As regards the choice of the source, a pulsed excimer laser, which mainly emits in the ultraviolet range and whose use is known for carrying out photoablation or marking, will preferably be used. It may be for example an excimer KrF ($\lambda$=248 nm) with short pulses (20 ns) or an excimer XeF ($\lambda$=308 nm) with long pulses (250 ns). "Radiation features" means fluence, the number of pulses and their frequency.

The adjustment of these features has to be carried out between a lower limit where fissures can be observed, but without sufficient lowering of the electrical conductivity, and an upper limit causing ablation of the TCO film, making the contours of the electrodes visible, given that the usual insulating space between the electrodes is of the order of several tens of millimeters. It is clearly possible, as indicated in the aforecited European Patent Application No. 03005615.4, to fill these spaces with a transparent dielectric material enabling optical compensation to be obtained.

The method according to the invention thus has the advantage of not requiring the above step, and thus of being more economical. Nor does it impose the difficult choice of a dielectric material having a refractive index and thickness adapted to obtain satisfactory optical compensation, given the peculiar features of the TCO film (refractive index and thickness).

After the electrodes have been structured, it can be advantageous to leave the substrate in the enclosed space, to replace the previous mask with another mask whose UV transparent window allows a deposition of a transparent protective film to be made over the entire substrate, i.e. the electrodes and the non-conductive spaces, with the possible exception of the contact zones of the electrodes, by introducing a precursor gas into the enclosed space. A material whose nature and thickness allow anti-reflective properties to be obtained will preferably be used to form the protective film. The film also has the advantage of stabilising the nano fissures over time.

Thus, a transparent electrode with invisible electrodes can be used in all of the applications cited in the preamble while offering superior qualities of transparency and uniformity to those of the known products of the prior art.

Thus, in accordance with a first embodiment of the present invention, a transparent substrate with invisible electrodes including a transparent support on which there is deposited a transparent conductive film wherein electrodes and their contact zones are structured with contours separated by non-conductive spaces, wherein the conductive film located at the site of said non-conductive spaces includes nano fissures for interrupting the electrical conductivity between neighbouring electrodes, without altering the path of a light ray in a manner perceptible to the naked eye. In accordance with a second embodiment of the present invention, the first embodiment is modified so that the transparent conductive film is a transparent conductive oxide (TCO), selected from the group comprising tin and indium oxide (ITO), $In_2O_3$ and $SnO_2$ doped with Sb. In accordance with a third embodiment of the present invention, the first embodiment is modified so that the transparent conductive film is a doped conductive polymer with conjugated double bonds selected from among a polyacetylene and polyanilines. In accordance with a fourth embodiment of the present invention, the first embodiment is modified so that an intermediate layer made of a transparent hard non-conductive material or hardcoating is inserted between the support and the conductive film. In accordance with a fifth embodiment of the present invention, the fourth embodiment is modified so that the intermediate layer is formed of a resin incorporating $SiO_2$ and having a thickness at least equal to 20 $\mu$m.

In accordance with a sixth embodiment of the present invention, the first embodiment is modified so that the majority of the nano fissures pass through the entire conductive film. In accordance with a seventh embodiment of the present invention, the second embodiment is modified so that the conductive film is an ITO film having a thickness comprised between 50 and 100 nm, preferably between 65 and 75 nm. In accordance with an eighth embodiment of the present invention, the first embodiment is modified so that the support is made of a material selected from among polymethylene methacrylate (PMMA) and polycarbonate (PC). In accordance with a ninth embodiment of the present invention, the first embodiment is modified so that the electrodes and the non-conductive spaces are further coated with a protective film also able to have anti-reflective properties. In accordance with a tenth embodiment of the present invention, the ninth embodiment is modified so that the protective film does not cover the contact zones of the electrodes. In accordance with an eleventh embodiment of the present invention, the first embodiment is modified so that it forms a touch-type control screen for an electronic apparatus in which it is integrated. In accordance with a twelfth embodiment of the present invention, the first embodiment is modified so that it forms at least one closing plate for a liquid crystal display cell or a photovoltaic cell for an electronic apparatus.

In accordance with a thirteenth embodiment of the present invention, a method of manufacturing a transparent substrate with invisible electrodes including a transparent support on which there is deposited a transparent conductive film wherein electrodes are structured with contours separated by non-conductive spaces, by UV radiation by means of a radiation source, wherein it comprises of the following steps:—placing the substrate, formed of the support and the conductive film possibly deposited on an intermediate layer made of a transparent hard non-conductive material, in a sealed enclosed space having a gaseous fluid supply inlet and a pump outlet;—inserting, between the UV radiation source and the substrate, a mask including windows transparent to UV radiation, said windows corresponding to the dielectric non-conductors, and—adjusting, as a function of the choice of materials used for the substrate and the emitting source, the UV radiation features to cause nano fissures to be created in the conductive film in the radiated zone, without removing any matter. In accordance with a fourteenth embodiment of the present invention, the thirteenth embodiment is modified so that it includes an additional step of depositing a conductive film, which may be anti-reflective, from a precursor gas with the same UV source, but replacing the mask used by another mask corresponding to the desired useful surface of the transparent substrate, while leaving the contact zones of the electrodes visible. In accordance with a fifteenth embodiment of the present invention, the thirteenth embodiment is modified so that the transparent conductive film is a transparent conductive oxide (TOC) selected from the group comprising tin and indium oxide (ITO), $In_2O_3$ and $SnO_2$ doped with Sb. In accordance with a sixteenth embodiment of the present invention, the thirteenth embodiment is modified so that the transparent conductive film is a doped conductive polymer selected from among a polyacetylene and polyanilines. In accordance with a seventeenth embodiment of the present invention, the thirteenth embodiment is modified so that the source is formed by an excimer laser selected from among XeF long pulse lasers and KrF short pulse lasers.

BRIEF DESCRIPTION OF THE DRAWINGS

Other features and advantages of the present invention will appear in the following description, given by way of illustrative and non-limiting example, with reference to the annexed drawings, in which:

FIG. 7 shows the assembly diagram for carrying out electrical measurements;

FIG. 8 is a view of a dielectric zone with nano fissures according to the invention;

FIG. 9 corresponds to FIG. 8 when the UV radiation features are insufficient;

FIG. 10 corresponds to FIG. 8 when the UV radiation features are, conversely, excessive, and FIG. 11 is an AFM image of a nano fissure referenced in FIG. 8.

DETAILED DESCRIPTION OF THE INVENTION

Figure 1:
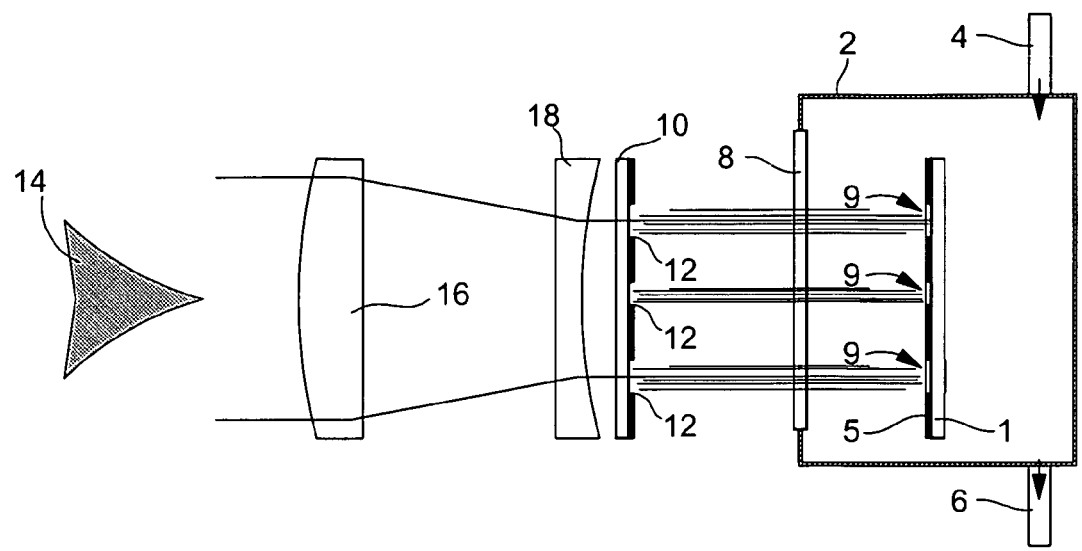
FIG. 1 is a schematic diagram of a device for obtaining a transparent substrate with invisible electrodes according to the invention.

FIG. 1 shows schematically the device which basically includes a source 14 of UV radiation formed by a laser source, an optical system of the type including a convex lens 16 and a diverging lens 18 for reducing the section of the laser beam in order to increase its fluence, a mask 10 including UV radiation transparent zones 12, and an enclosed space 2. Enclosed space 2 includes a window 8 transparent to UV radiation, a gas inlet 4 and a pump outlet 6. Enclosed space 2 can also include an additional inlet (not shown) for a vector gas of a precursor gas. Inside enclosed space 2 is placed a substrate which, in this example, includes a transparent base which is already coated with a TCO film 5. It would of course be possible to form the TCO film directly in enclosed space 2, for example by LICVD, but less interesting economically, given that the energy consumption would be 100 times greater.

The UV radiation source is formed by an excimer laser, such as an XeF laser (308 nm) with long impulses (250 ns) supplying a maximal energy of 150 mJ per impulse with a rectangular beam of 1.9×2.4 cm², or a KrF laser (248 nm) with short impulses (20 ns) supplying a maximal energy of 180 mJ per impulse with a rectangular beam of 1.5×4 cm². Other lasers, for example a triple or quadruple Nd:YAG laser, can obviously be used, provided their features are adapted to the desired object.

Figure 2:
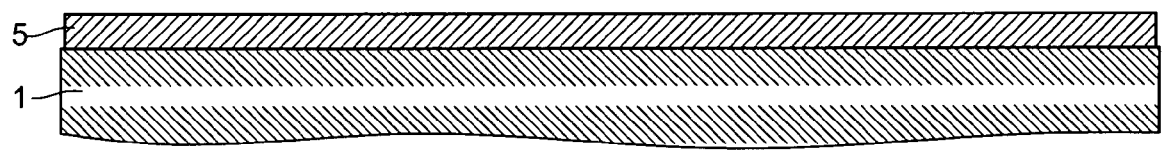
FIGS. 2 and 3 show the manufacturing steps of a first embodiment.
Figure 3:
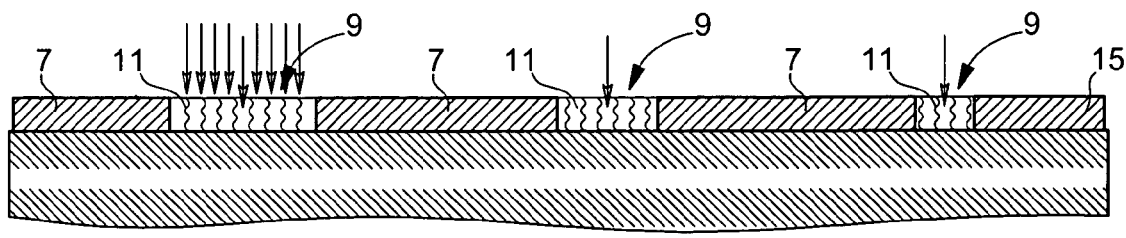

FIGS. 2 and 3 show the simplest embodiment wherein a support 1 made of a transparent material is coated with a continuous TCO film, such as a tin and indium oxide (ITO) having, in this example, a thickness of 70 nm. It would of course be possible to use another TCO, such as $In_2O_3$ or $SnO_2$ doped with Sb, and to have a different thickness, comprised for example between 50 and 100 nm, preferably between 65 and 75 nm. As shown in FIG. 3, after UV radiation in enclosed space 2, non-conductive spaces 9 are formed, created by nano fissures 11 passing through the ITO film and electrically separating electrodes 7 and contact zones 15. In order to obtain these fissures and not ablation of the ITO in these electric spaces 9, the UV radiation features have to be adjusted within limits such that the depth of the nano fissures causes sufficient interruption in the conductivity to electrically insulate the neighbouring electrodes, without thereby causing ablation of the ITO film, as is explained in more detail for the second embodiment corresponding to FIGS. 4 to 6.

Figure 4:
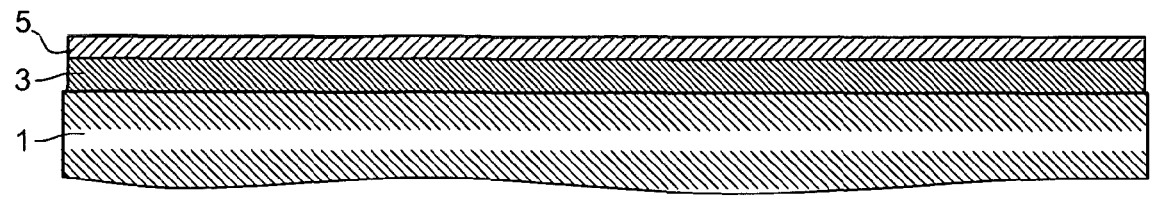
FIGS. 4, 5 and 6 show the manufacturing steps of a second embodiment.

In FIG. 4, it can be seen that the substrate is formed by a support 1, which is, in this example, made of PMMA, on which there is deposited an intermediate layer 3 of a hard, non-conductive transparent material (hardcoating). This intermediate layer, which protects the PMMA and which contributes to stabilising the ITO base after nano-fissuring, is for example formed of a resin incorporating SiO2, and its thickness is of the order of 20 μm. This substrate is placed in enclosed space 2, then subjected, through mask 10, to UV radiation from a source 14. In the examples that follow, the source is formed by a XeF excimer laser (λ=308 nm) with long impulses (250 ns), with an illumination feature of 20 impulses at 5 Hz with an illuminated surface of 3×4 mm², while varying the fluence.

Figure 5:
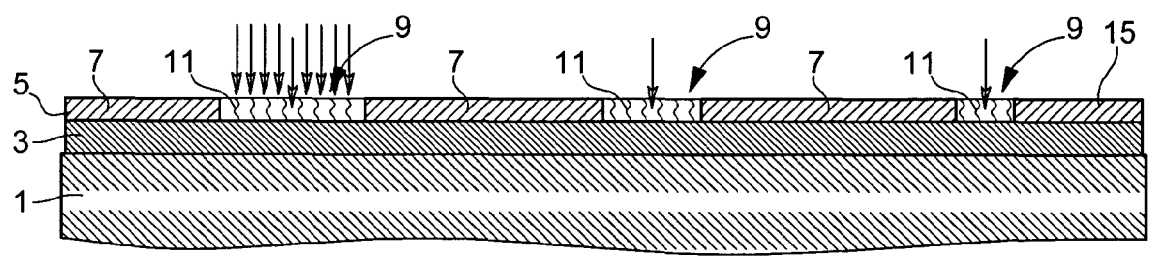

FIG. 5 shows schematically the formation of nano fissures 11 creating non-conductive spaces 9 separating electrodes 7 and contact zones 15.

Figure 6:
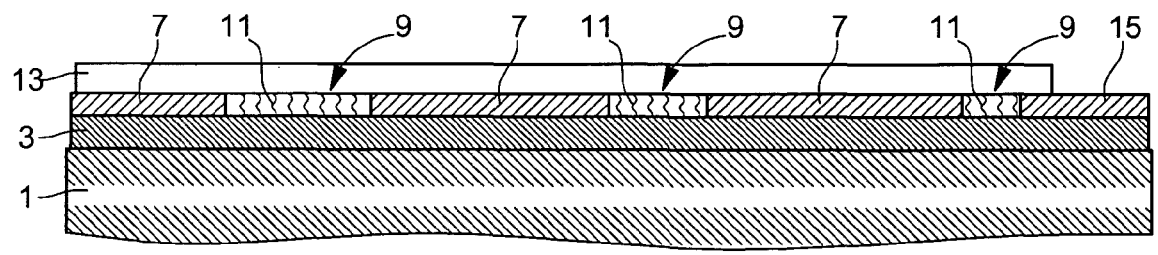

FIG. 6 shows an optional step in which the substrate remains in enclosed space 2, but in which mask 10 is replaced by another mask whose radiation transparent window delimits the useful contour of the transparent substrate. A precursor gas is then introduced into the enclosed space via the supply conduit 4, allowing deposition of a protective film 13 while again adjusting the UV radiation features. Film 13 is for example formed by a deposition of $SiO_2$ and $TiO_2$ of uniform thickness, possibly altered to have anti-reflective properties. Film 13 also, on the one hand, enables nano fissures 11 to be stabilised over time, and on the other hand, to make the electrodes even less visible by filling the spaces between the nano fissures.

FIGS. 7 to 11 show with examples how the UV radiation features should be adjusted. Three identical samples are used, including an intermediate layer having a thickness of 20 μm on which an ITO film 70 nm thick has been deposited, and a surface of 3×4 mm has been illuminated with a 308 nm long pulse excimer laser with 20 pulses at 5 Hz, while varying the fluence.

The diagram shown in FIG. 7 shows a mounting arrangement for measuring the electric features of the samples in the illuminated zone. A generator 17 delivers a sinusoidal voltage of 1.77 V to a circuit including, in series, a resistor 19 calibrated between 2.2 kΩ and 570 kΩ and a sample portion 23, which allows current values comprised between 0.7 mA and 0.2 μA to be deduced by measuring, by means of a voltameter 21, the voltage at the terminals of resistor 19. ($R_{ech.} = V_{gen.} - $ V)/I). The "sample portion" 23 is taken between two points 24 at a distance of 0.3 to 0.5 mm from each side of a nano fissure, as shown in FIG. 8. A loop-shaped end can also be used (not shown), i.e. a softened contact to prevent the ITO film being damaged by the tips.

When the sample has not undergone any UV radiation, the resistance between the tips is 180Ω for a current of 1.5 mA passing through the sample with a calibrated resistance of 670Ω.

FIG. 8 shows the image observed under a microscope in a reflective mode with a magnifying power of around 15, after radiation with a laser beam having the aforecited features and a fluence of 65 mJ/cm$^2$. It may be seen that the nano fissures are great in numbers. By carrying out the same electric measurements as for the non-illuminated sample with the same distance between the measuring tips, the alternating current is no longer measurable (<<0.2 μA), which means that the ITO pads located on either side of fissure 11 are sufficiently electrically insulated.

This is confirmed by the AFM imaging through a nano fissure shown in FIG. 11. It can be seen that the nano fissure has a maximal depth of 75 nm, i.e. that the base of said nano fissure very slightly penetrates insulating hardcoating 3 such that the lower edges of the nano fissure are electrically separated by approximately 70 nm. It can also be seen that on the upper part the maximal width of nano fissure 11 is of the order of 500 nm, i.e. much too small a width to be able to be perceived by the naked eye.

By subjecting a second sample to the same radiation but with lower fluence, namely 60 mJ/cm$^2$, fissures are also obtained, as shown in FIG. 9, but with a slight variation in the electric features. With an initial resistance of 670Ω, there is observed a resistance of 800Ω between the tips and a current of 1.19 mA meaning that significant conductivity still exists at the fissure. By AFM imaging (not shown) it can in fact be determined that the maximal depth of the fissure is 66 nm, i.e. there remains an electric conduction connection at the base of the fissure.

Conversely, with reference to FIG. 10, it can be seen that by increasing the fluence of 65 mJ/cm$^2$ to 70 mJ/cm$^2$, zones 22 are formed in which the ITO film is removed over a sufficient width to make the zone separating the electrodes visible to the naked eye. The electric conductivity is obviously interrupted, but a complementary manufacturing step then has to be carried out to obtain optical compensation, for example in accordance with the method proposed in the aforecited EP Patent No. 03005615.4.

It is clear that those skilled in the art can, depending on the nature of the TCO film, and even that of the intermediate layer and their respective thickness, define the UV radiation features as a function of the laser source used so as to find a location between a lower limit where the interruption to electrical conductivity is insufficient and an upper limit where the TCO film is torn away.

Thus, one can, in the same measuring conditions as those described with reference to FIG. 8, obtain the same results as regards electrical conductivity when the radiated zone has a surface of 1×4 mm$^2$ with a fluence of 85 mJ/cm$^2$.

By using a 248 nm short pulse laser, the same result as in FIG. 8 is also obtained with a sample of 2×8 mm$^2$, with 50 pulses at 5 Hz and a fluence of 50 mJ/cm$^2$.

Depending upon the laser source used, which is not limited to an excimer laser, those skilled in the art can thus easily, via a few preliminary attempts, determine the optimal conditions for causing nano fissures without removing matter, but sufficiently to interrupt the electrical conductivity between electrodes.

What is claimed is:

1. A transparent substrate with invisible electrodes, the transparent substrate including:
   (a) a transparent support; and
   (b) a transparent conductive film deposited on the transparent support,
   wherein the transparent conductive film includes invisible electrodes having invisible contact zones, structured with contours separated by non-conductive spaces, wherein the non-conductive spaces include nano fissures formed in the conductive film so as to interrupt electrical conductivity between neighbouring electrodes, and so as to form the invisible electrodes and the invisible contact zones, and wherein the nano fissures have a maximum width of about 500 nanometers.

2. The substrate according to claim 1, wherein the transparent conductive film is a transparent conductive oxide (TCO), selected from the group consisting of tin and indium oxide (ITO), $In_2O_3$ and $SnO_2$ doped with Sb.

3. The substrate according to claim 2, wherein the conductive film is an ITO film having a thickness of between 50 and 100 nm.

4. The substrate according to claim 2, wherein the conductive film is an ITO film having a thickness of between 65 and 75 nm.

5. The substrate according to claim 1, wherein the transparent conductive film is a doped conductive polymer with conjugated double bonds, selected from the group consisting of a polyacetylene and polyanilines.

6. The substrate according to claim 1, wherein an intermediate layer made of a transparent hard non-conductive material or hard coating is inserted between the support and the conductive film.

7. The substrate according to claim 6, wherein the intermediate layer is formed of a resin incorporating $SiO_2$ and having a thickness at least equal to 20 μm.

8. The substrate according to claim 1, wherein the majority of the nano fissures pass through the entire conductive film.

9. The substrate according to claim 1, wherein the support is made of a material selected from the group consisting of polymethylene methacrylate (PMMA) and polycarbonate (PC).

10. The substrate according to claim 1, wherein the electrodes and the non-conductive spaces are further coated with a protective film that have anti-reflective properties.

11. The substrate according to claim 10, wherein the protective film does not cover the contact zones of the electrodes.

12. The substrate according to claim 1, wherein the substrate forms a touch-type control screen for an electronic apparatus in which the substrate is integrated.

13. The substrate according to claim 1, wherein the substrate forms at least one closing plate for a liquid crystal display cell or a photovoltaic cell for an electronic apparatus.

* * * * *